(12) United States Patent
Sung et al.

(10) Patent No.: US 8,455,344 B2
(45) Date of Patent: Jun. 4, 2013

(54) METHOD OF MANUFACTURING NON-VOLATILE MEMORY DEVICE

(75) Inventors: Suk-Kang Sung, Seongnam-si (KR);
Choong-Ho Lee, Yongin-si (KR);
Dong-Uk Choi, Seongnam-si (KR);
Hee-Soo Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 17 days.

(21) Appl. No.: 13/238,084

(22) Filed: Sep. 21, 2011

(65) Prior Publication Data

US 2012/0015512 A1    Jan. 19, 2012

Related U.S. Application Data

(62) Division of application No. 12/318,451, filed on Dec. 30, 2008, now Pat. No. 8,044,453.

(30) Foreign Application Priority Data

Jan. 2, 2008   (KR) .................. 10-2008-0000101

(51) Int. Cl.
*H01L 21/28*   (2006.01)

(52) U.S. Cl.
USPC ........... 438/591; 257/288; 257/324; 257/326; 257/E21.19; 257/E29.309; 438/197; 438/287

(58) Field of Classification Search
USPC ............ 257/324, E29.309, E21.19; 438/197, 438/287, 591
See application file for complete search history.

(56) References Cited

U.S. PATENT DOCUMENTS

| | | | |
|---|---|---|---|
| 7,692,236 B1 * | 4/2010 | Brennan et al. | 257/324 |
| 2006/0208302 A1 | 9/2006 | Shin et al. | |
| 2007/0126054 A1 | 6/2007 | Jung | |
| 2007/0155124 A1 * | 7/2007 | Ahn et al. | 438/424 |
| 2008/0081442 A1 * | 4/2008 | Kim et al. | 438/478 |
| 2009/0053871 A1 | 2/2009 | Ahn | |

FOREIGN PATENT DOCUMENTS

| | | |
|---|---|---|
| JP | 2000-286349 A | 10/2000 |
| KR | 10-0643468 B1 | 10/2006 |
| KR | 10-0643542 B1 | 11/2006 |

* cited by examiner

*Primary Examiner* — Lynne Gurley
*Assistant Examiner* — Vernon P Webb
(74) *Attorney, Agent, or Firm* — Lee & Morse, P.C.

(57) ABSTRACT

A non-volatile memory device includes field insulating layer patterns on a substrate to define an active region of the substrate, upper portions of the field insulating layer patterns protruding above an upper surface of the substrate, a tunnel insulating layer on the active region, a charge trapping layer on the tunnel insulating layer, a blocking layer on the charge trapping layer, first insulating layers on upper surfaces of the field insulating layer patterns, and a word line structure on the blocking layer and first insulating layers.

13 Claims, 9 Drawing Sheets

METHOD OF MANUFACTURING NON-VOLATILE MEMORY DEVICE

CROSS REFERENCE TO RELATED APPLICATION

This is a divisional application based on application Ser. No. 12/318,451, filed Dec. 30, 2008 now U.S. Pat. No. 8,044,453, the entire contents of which is hereby incorporated by reference.

BACKGROUND

1. Field

Example embodiments relate to a non-volatile memory device and to a method of manufacturing the same. More particularly, example embodiments relate to a non-volatile memory device including a charge trapping layer, and to a method of manufacturing the non-volatile memory device.

2. Description of the Related Art

Generally, a semiconductor memory device may be classified, e.g., as a volatile memory device or as a non-volatile memory device. A volatile memory device, e.g., a dynamic random access memory (DRAM) device, a static random access memory (SRAM) device, etc., may have a relatively fast data input/output speed but may lose data over time. A non-volatile memory device, e.g., an electrically erasable programmable read-only memory (EEPROM) device, a flash EEPROM memory device, etc., may have a relatively slow data input/output but may continuously store data over time.

A conventional non-volatile memory device, e.g., a flash EEPROM device, may electrically program/erase data by a Fowler-Nordheim tunneling (F-N tunneling) or a channel hot electron injection. For example, the flash EEPROM device may be classified as a floating gate type non-volatile memory device or a charge trap type non-volatile memory device, e.g., a metal-oxide-nitride-oxide semiconductor (MONOS) device.

A conventional charge trap type non-volatile memory device may include a tunnel oxide layer on a semiconductor substrate, a charge trapping layer for trapping electrons from a channel region, a dielectric layer formed on the charge trapping layer, a gate electrode formed on the dielectric layer, and a spacer formed on a sidewall of the gate electrode.

However, when thermal stress is applied to the conventional charge trapping layer, electrons in the charge trapping layer may laterally diffuse, so thermal stress characteristics of the non-volatile memory device may be deteriorated. For example, when the conventional non-volatile memory device is heated at a temperature of about 200° C. for about 2 hours, a threshold voltage of the non-volatile memory device may be substantially decreased. The threshold voltage of the non-volatile memory device may be decreased even further, when the programming/erasing operations of the non-volatile memory device are performed about 1,000 times to about 1,200 times, and the non-volatile memory device is heated at a temperature of about 200° C. for about 2 hours.

SUMMARY

Example embodiments are therefore directed to a non-volatile memory device and to a method of manufacturing the same, which substantially overcome one or more of the disadvantages and shortcomings of the related art.

It is therefore a feature of an example embodiment to provide a non-volatile memory device that is capable of preventing diffusions of charges.

It is another feature of an example embodiment to provide a method of manufacturing a non-volatile memory device that is capable of preventing diffusions of charges.

At least one of the above and other features and advantages of the present invention may be realized by providing a non-volatile memory device, including field insulating layer patterns on a substrate to define an active region of the substrate, upper portions of the field insulating layer patterns protruding above an upper surface of the substrate, a tunnel insulating layer on the active region, a charge trapping layer on the tunnel insulating layer, a blocking layer on the charge trapping layer, first insulating layers on upper surfaces of the field insulating layer patterns, and a word line structure on the blocking layer and first insulating layers.

The charge trapping layer and the first insulating layers may include a substantially same material. The first insulating layers may be connected to the charge trapping layer via extensions, the extension being positioned along side surfaces of the field insulating layer patterns and being thinner than the charge trapping layer. The non-volatile memory device may further include second insulating layers on the first insulating layers, the second insulating layers being between the word line structure and the first insulating layers. The blocking layer and the second insulating layers may include a substantially same material. The second insulating layers may be connected to the blocking layer via extensions, the extension being positioned along side surfaces of the field insulating layer patterns and being thinner than the blocking layer.

At least one of the above and other features and advantages of the present invention may be realized by providing a method of manufacturing a non-volatile memory device, including forming field insulating layer patterns on a substrate to define an active region of the substrate, upper portions of the field insulating layer patterns protruding above an upper surface of the substrate, forming a tunnel insulating layer on the active region, forming a charge trapping layer on the tunnel insulating layer, forming a blocking layer on the charge trapping layer, forming first insulating layers on upper surfaces of the field insulating layer patterns, and forming a word line structure on the blocking layer and the first insulating layers.

The charge trapping layer and the first insulating layers may be formed by a physical vapor deposition (PVD) process. The charge trapping layer and the first insulating layers may be formed by a sputtering process. Forming the first insulating layers may include forming extensions connecting the first insulating layers and the charge trapping layer along side surfaces of the field insulating layer patterns, the extensions of the first insulating layers being thinner than the charge trapping layer. Forming the first insulating layers may further include removing the extensions of the first insulating layers by an isotropic etching process, such that the first insulating layers may be completely separated from the charge trapping layer. The method may further include forming second insulating layers on the first insulating layers, the second insulating layers being between the word line structure and the first insulating layers. The blocking layer and the second insulating layers may be formed by a physical vapor deposition (PVD) process. The blocking layer and the second insulating layers may be formed by a sputtering process. Forming the second insulating layers may include forming extensions connecting the second insulating layers and the blocking layer along side surfaces of the field insulating layer patterns, the extensions of the second insulating layers being thinner than the blocking layer. Forming the second insulating layers may further include removing the extensions of the second insulating layers by an isotropic etching process, such that the second insulating layers may be completely separated from the blocking layer.

Forming the blocking layer may include forming the blocking layer to be wider than the charge trapping layer along a first direction, the first direction extending in parallel to a line connecting adjacent word line structures. The method may further include forming a sacrificial layer on the charge trapping layer and field insulating layer patterns, the sacrificial layer filling spaces between adjacent field insulating layer patterns, performing a planarization process to remove the sacrificial layer, the first insulating layers and upper portions of the field insulating layer patterns, forming a conductive layer on the blocking layer, a lowermost surface of the conductive layer facing the blocking layer being substantially planar, and forming the word line structure on the conductive layer. Performing the planarization process may include forming upper surfaces of the charge trapping layer and field insulating layer patterns to be substantially coplanar, and forming the blocking layer on the upper surfaces of the charge trapping layer and field insulating layer patterns, a lowermost surface of the blocking layer facing the charge trapping layer being substantially planar. The method may further include forming second insulating layers on the first insulating layers, and performing the planarization process may include forming upper surfaces of the blocking layer and field insulating layer patterns to be substantially coplanar.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE EMBODIMENTS

Korean Patent Application No. 10-2008-0000101, filed on Jan. 2, 2008, in the Korean Intellectual Property Office, and entitled: "Non-Volatile Memory Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. In addition, it will be understood that when an element is referred to as being "connected" or "coupled" to another element, it can be directly connected or coupled to the other element or intervening elements may be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 13 illustrate cross-sectional views of stages in a method of manufacturing a non-volatile memory device in accordance with some example embodiments.

Figure 1:
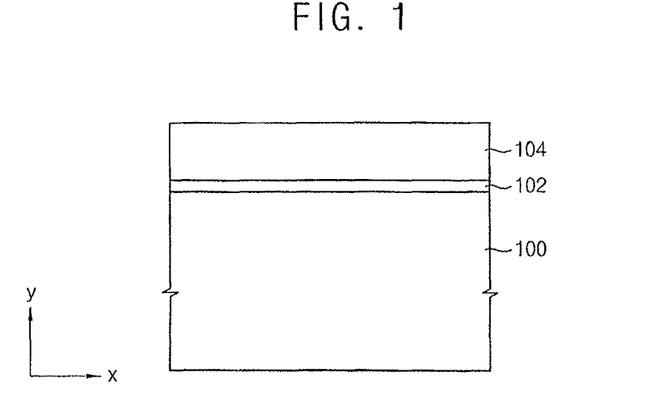
FIGS. 1 to 11 illustrate cross-sectional views of sequential stages in a method of manufacturing a non-volatile memory device in accordance with an example embodiment.

Referring to FIG. 1, a pad oxide layer 102 may be formed on a semiconductor substrate 100, e.g., on an upper surface of semiconductor substrate 100. The semiconductor substrate 100 may be, e.g., a silicon wafer. A mask layer 104 may be formed on the pad oxide layer 102.

In some example embodiments, the pad oxide layer 102 may be formed to have a thickness of about 70 angstroms to about 100 angstroms by, e.g., a thermal oxidation process, a chemical vapor deposition (CVD) process, etc. The pad oxide layer 102 may be formed at a temperature of about 750° C. to about 900° C. to treat the upper surface of the semiconductor substrate 100.

In some example embodiments, the mask layer 104 may include, e.g., silicon nitride. The mask layer 104 may be formed to have a thickness of about 1,500 angstroms by, e.g., a low pressure chemical vapor deposition (LPCVD) process, a plasma enhanced chemical vapor deposition (PECVD) process, etc., using any suitable gas, e.g., one or more of a $SiH_2Cl_2$ gas, a $SiH_4$ gas, an $NH_3$ gas, etc.

Figure 2:
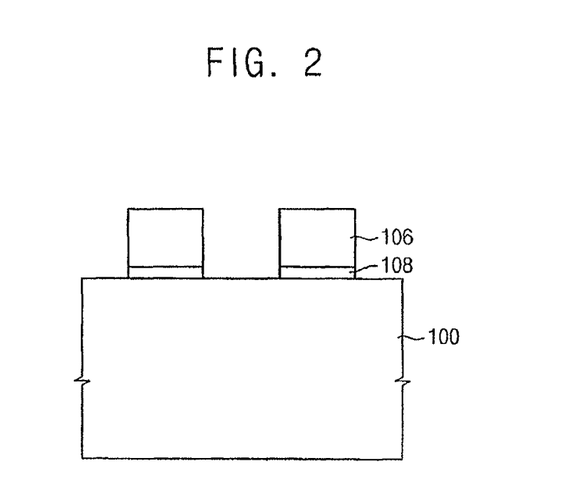

Referring to FIG. 2, a photoresist pattern (not shown) may be formed on the mask layer 104 by, e.g., a photolithography process. The photoresist pattern may be configured to partially expose an upper surface of the mask layer 104. The mask layer 104 and the pad oxide layer 102 may be sequentially etched using the photoresist pattern as an etch mask to form mask patterns 106 and pad oxide layer patterns 108, respectively, on the semiconductor substrate 100. The upper surface of the semiconductor substrate 100, i.e., a surface facing the pad oxide layer patterns 108, may be partially exposed by the mask patterns 106 and the pad oxide layer patterns 108, e.g., portions of the upper surface of the semiconductor substrate 100 may be exposed between adjacent pad oxide layer patterns 108. After forming the mask patterns 106 and the pad oxide layer patterns 108, the photoresist pattern may be removed by, e.g., an ashing process and/or a stripping process.

Figure 3:
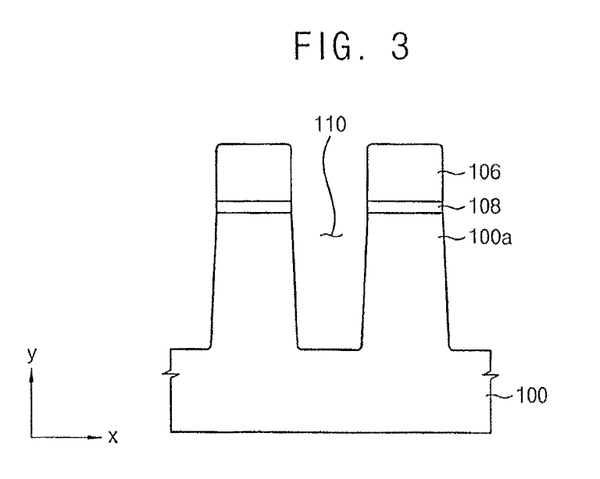

Referring to FIG. 3, the upper surface of the semiconductor substrate 100 may be etched using the mask patterns 106 as an etch mask to form trenches 110 along a first direction, e.g., along the z-axis, to a predetermined depth, e.g., along the y-axis. For example, the trenches 110 may have a depth of about 1,000 angstroms to about 5,000 angstroms, i.e., as measured from the upper surface of the semiconductor substrate 100 in an upward direction along the y-axis.

Figure 4:
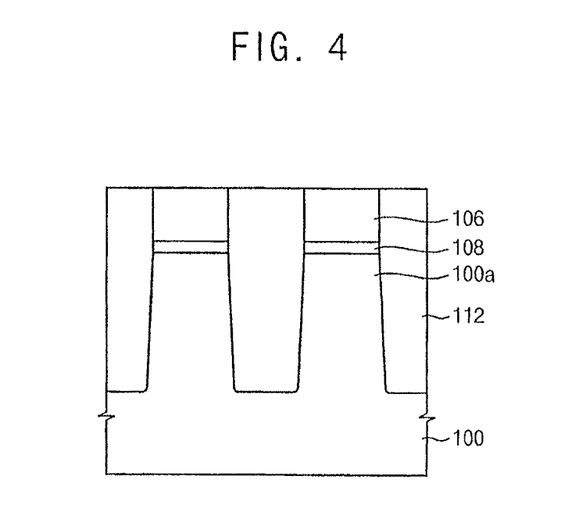

Referring to FIG. 4, after forming the trenches 110, a field insulating layer (not shown) may be formed on the semiconductor substrate 100 to fill up the trenches 110, e.g., completely fill the trenches 110. For example, the field insulating layer may include a silicon oxide layer, e.g., one or more of undoped silicate glass (USG), tetra ethyl ortho silicate (TEOS), high density plasma (HDP) oxide, etc. The field insulating layer may be formed by, e.g., a high density plasma chemical vapor deposition (HDPCVD) process using one or more of a $SiH_4$ gas, an $O_2$ gas, and an Ar gas.

After forming the field insulating layer in the trenches 110, an upper portion of the field insulating layer may be removed to form field insulating layer patterns 112 in the trenches 110. For example, after forming the field insulating layer, a planarization process, e.g., a chemical mechanical polishing (CMP) process, may be performed on the field insulating layer until the mask patterns 106 is exposed to form the field insulating layer patterns 112, i.e., so upper surfaces of the field insulating layer patterns 112 and mask patterns 106 may be substantially coplanar.

The field insulating layer patterns 112 may define active regions 100a of the semiconductor substrate 100, e.g., the active region 100a may extend in the first direction. For example, a plurality of field insulating layer patterns 112 may be formed adjacent to each other along the first direction, so an active region 100a may be defined along the first direction between two adjacent field insulating layer patterns 112. Upper portions of the field insulating layer patterns 112 may protrude from the upper surface of the semiconductor substrate 100, i.e., a distance between a lowermost surface of the semiconductor substrate 100 and upper surfaces of the adjacent field insulating layer patterns 112 facing away from the semiconductor substrate 100 along the y-axis may be larger than a distance between the lowermost and uppermost surfaces of the semiconductor substrate 100 along the y-axis.

Figure 5:
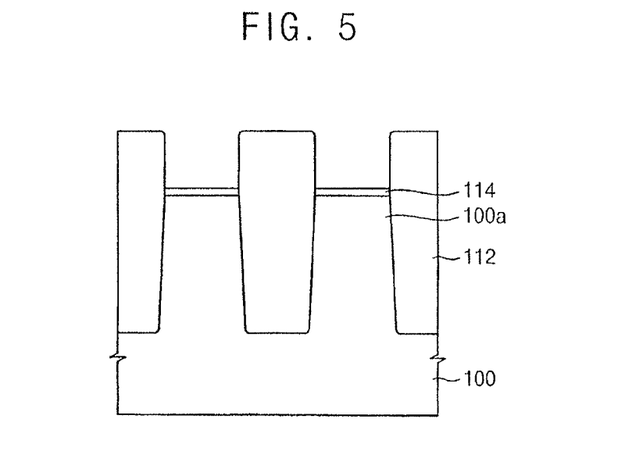

Referring to FIG. 5, the mask patterns 106 and the pad oxide layer patterns 108 may be removed to expose an upper surface of the active region 100a, e.g., a portion of the upper surface of the active region 100a may be exposed between adjacent field insulating layer patterns 112. In some example embodiments, the mask patterns 106 may be removed using, e.g., a phosphoric acid solution, and the pad oxide layer patterns 108 may be removed using, e.g., a diluted hydrofluoric acid solution.

Next, as illustrated in FIG. 5, a tunnel insulating layer 114 may be formed on the exposed upper surface of the active region 100a. In some example embodiments, the tunnel insulating layer 114 may include silicon oxide. The tunnel insulating layer 114 may be formed to have a thickness of about 20 angstroms to about 80 angstroms, e.g., about 35 angstroms, by a thermal oxidation process.

Alternatively, the tunnel insulating layer 114 may include a material having a dielectric constant higher than that of silicon oxide. The material having the high dielectric constant may be deposited by, e.g., a CVD process, an atomic layer deposition (ALD) process. etc.

Figure 6:
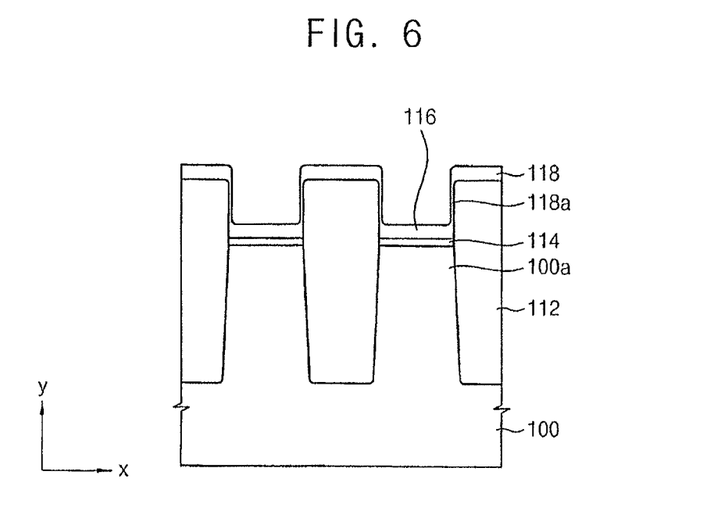

Referring to FIG. 6, after forming the tunnel insulating layer 114, a charge trapping layer 116 and first insulating layers 118 may be formed on the tunnel insulating layer 114 and field insulating layer patterns 112, respectively. The charge trapping layer 116 and first insulating layers 118 may be formed substantially simultaneously, as will be discussed in more detail below. The charge trapping layer 116 may trap charges from the active region 100a, and the first insulating layers 118 may insulate adjacent charge trapping layers 116 from each other.

The charge trapping layer 116 may be formed on the tunnel insulating layer 114, and may include, e.g., silicon nitride or a material having a dielectric constant higher than that of silicon nitride. For example, the charge trapping layer 116 may include one or more of a metal oxide, a metal oxynitride, a metal silicon oxide, a metal silicon oxynitride, etc. Examples of suitable metals may include one or more of hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), etc.

In some example embodiments, the charge trapping layer 116 may be formed by a physical vapor deposition (PVD) process, e.g., a sputtering process. As a result, the charge trapping layer 116 may be formed on the tunnel oxide layer 114 at a substantially same time as the first insulating layers 118 may be formed on the upper surfaces of the field insulating layer patterns 112, i.e., surfaces of the field insulating layer patterns 112 facing away from the semiconductor substrate 100. In other words, during deposition of material on the tunnel oxide layer 114 via, e.g., sputtering, the material may be deposited continuously on the tunnel oxide layer 114 and on exposed surfaces of the field insulating layer patterns 112 to form the charge trapping layer 116 on the tunnel oxide layer 114 and the first insulating layers 118 on the field insulating layer patterns 112. Accordingly, the charge trapping layer 116 may be in contact, e.g., direct contact, with an adjacent first insulating layer 118 via an extension 118a, i.e., a material layer deposited along side surfaces of the field insulating layer patterns 112 and connecting the first insulating layers 118 with the charge trapping layer 116. That is, the extension 118a of the first insulating layers 118 may be formed by, e.g., the sputtering process, and may have a smaller thickness than a thickness of the charge trapping layer 116. In this respect, it is noted that the thickness of the extension 118a may be measured along a horizontal direction, i.e., along the x-axis, and the thickness of the charge trapping layer 116 may be measured along a vertical direction, i.e., along the y-axis.

Figure 7:
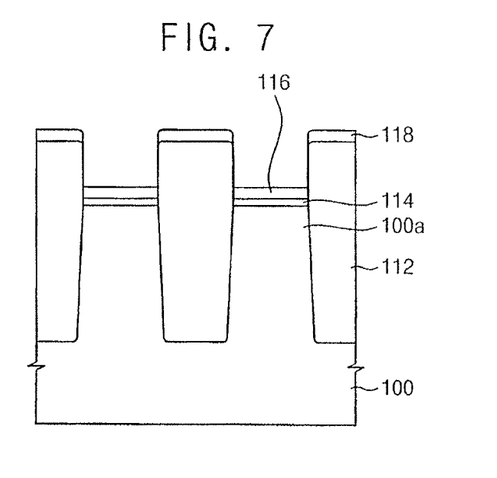

Referring to FIG. 7, the extensions 118a of the first insulating layers 118 may be removed by, e.g., an isotropic etching process. Removal of the extensions 118a may disconnect the charge trapping layer 116 from the first insulating layers 118, e.g., the charge trapping layer 116 may be spaced apart and completely separated from the first insulating layers 118 along the vertical direction, so charges trapped in the charge trapping layer 116 may not diffuse from the charge trapping layer 116 to the first insulating layers 118.

For example, the extensions 118a of the first insulating layers 118 may be removed by a wet etching process using an acid solution, e.g., a phosphoric acid solution, a sulfuric acid solution, an oxalic acid solution, etc. It is noted that during removal of the extensions 118a, a portion of an upper surface of the charge trapping layer 116 may be removed.

In detail, when the extensions 118a of the first insulating layers 118 are removed by a wet etching using a phosphoric acid solution, the phosphoric acid solution may include about 5% to about 50% by weight of water, e.g., about 5% to about 10% by weight of water. For example, the wet etching process may use a phosphoric acid solution including about 8% by weight of water.

In some example embodiments, the wet etching process using the phosphoric acid solution may be performed at a temperature of about 100° C. to about 200° C. For example, the wet etching process using the phosphoric acid solution may be performed at a temperature of about 150° C. to about 170° C., e.g., at about 160° C.

In some example embodiments, the wet etching process using the phosphoric acid solution may be performed in an airtight chamber. In order to prevent explosion of the airtight chamber, an inner pressure of the airtight chamber may be about 2 atm or less.

For example, for dipping the semiconductor substrate 100 into a phosphoric acid solution, the semiconductor substrate 100 may be loaded into a processing chamber, and the processing chamber may be made airtight using a cover. Then, an inactive gas may be supplied to the airtight processing chamber, e.g., the inactive gas may remove air and control the inner pressure in the airtight processing chamber. Next, the airtight processing chamber may be heated to control a temperature of the phosphoric acid solution. The inner pressure of the airtight processing chamber may be increased due to the temperature increase, so that a vaporization temperature of the phosphoric acid solution may increase. After performing the wet etching process using the phosphoric acid solution, the airtight processing chamber may be cooled to decrease the temperature of the phosphoric acid solution and the inner pressure of the airtight chamber. When the phosphoric acid solution is sufficiently cooled, the semiconductor substrate 100 may be unloaded from the airtight processing chamber.

When the extensions 118a of the first insulating layers 118 are removed by a wet etching using a sulfuric acid solution, the sulfuric acid solution may include about 5% to about 50% by weight of water, e.g., about 5% to about 10% by weight of water. For example, the wet etching process may use a sulfuric acid solution including about 8% by weight of water.

In some example embodiments, the wet etching process using the sulfuric acid solution may be performed at a temperature of about 100° C. to about 200° C. For example, the wet etching process using the sulfuric acid solution may be performed at a temperature of about 110° C. to about 160° C., e.g., at about 120° C.

Alternatively, it is noted that the isotropic etching process for removing the extensions 118a of the first insulating layers 118 may be omitted. When the extensions 118a of the first insulating layers 118 remain along the side surfaces of the field insulating layer patterns 112, diffusion of charges from the charge trapping layers 116 to the first insulating layers 118 may be substantially reduced because the thickness of the extensions 118a may be substantially smaller than the thickness of the charge trapping layer 116.

Figure 8:
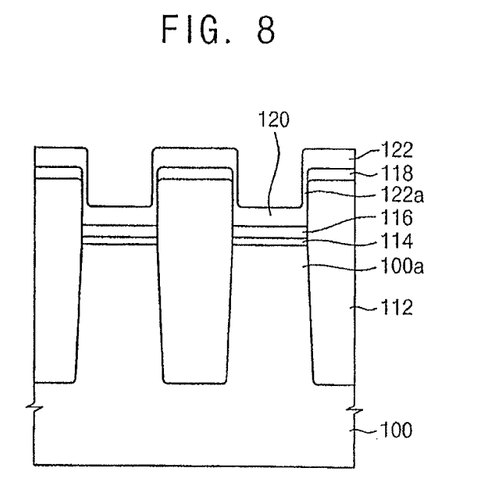

Referring to FIG. 8, a blocking layer 120 and second insulating layers 122 may be formed on the charge trapping layer 116 and first insulating layers 118, respectively. The blocking layer 120 and second insulating layers 122 may be formed substantially simultaneously. The blocking layer 120 may provide an electrical insulation between the charge trapping layer 116 and a gate electrode formed subsequently.

The blocking layer 120 may be formed on the charge trapping layer 116, e.g., between adjacent field insulating layer patterns 112, and may include, e.g., one or more of a silicon oxide, a silicon oxynitride, a material having a dielectric constant higher than that of a silicon nitride, etc. The material having a high dielectric constant may include one or more of a metal oxide, a metal oxynitride, a metal silicon oxide, a metal silicon oxynitride, etc. Examples of suitable metals in the blocking layer 120 may include one or more of hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), aluminum (Al), etc. For example, the blocking layer 120 may include aluminum oxide ($Al_2O_3$).

In some example embodiments, the blocking layer 120 may be formed by the PVD process, e.g., the sputtering process. As a result, the blocking layer 120 may be formed on the charge trapping layer 116 at a substantially same time the second insulating layers 122 may be formed on the upper surfaces of the first insulating layers 118. In other words, during deposition of material on the charge trapping layer 116 via, e.g., sputtering, the material may be deposited continuously on the charge trapping layer 116, side surfaces of the field insulating layer patterns 112, and first insulating layers 118 to form the blocking layer 120 on the charge trapping layer 116 and the second insulating layers 122 on the first insulating layers 118. Accordingly, the blocking layer 120 may be in contact with an adjacent second insulating layer 122 via an extension 122a, i.e., a substantially thinner layer than the blocking layer 120, extending downwardly, as was described previously with reference to extension 118a in FIG. 6.

Figure 9:
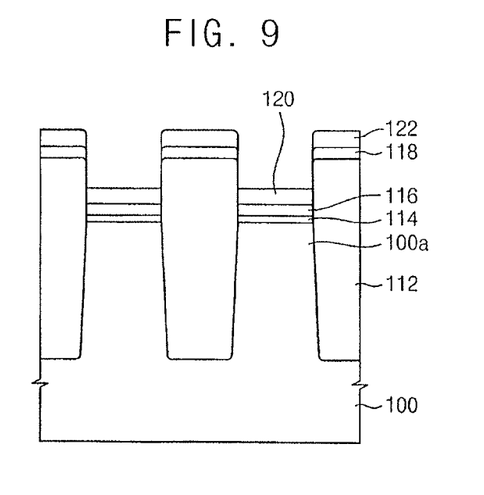

Referring to FIG. 9, the extensions 122a of the second insulating layers 122 may be removed by an isotropic etching process. Removal of the extensions 122a may be substantially the same as removal of the extensions 118a described previously with reference to FIG. 7 and, therefore, will not be repeated.

Alternatively, the isotropic etching process for removing the extensions 122a of the second insulating layers 122 may be omitted. In this case, the extensions 122a of the second insulating layers 122 may remain on the side surfaces of the field insulating layer patterns 112, as discussed previously with reference to extensions 118a.

Figure 10:
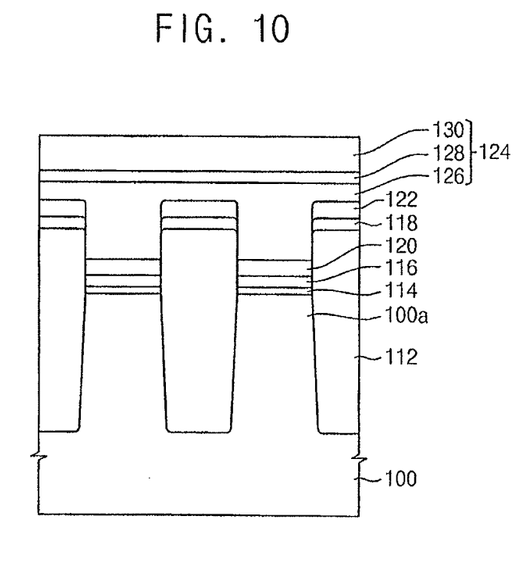

Referring to FIG. 10, a conductive layer 124 may be formed on the blocking layer 120 and the second insulating layers 122. In some example embodiments, the conductive layer 124 may include a first conductive layer 126, a barrier layer 128 and a second conductive layer 130. For example, the first conductive layer 126 may be deposited in spaces between adjacent field insulating layer patterns 112, e.g., the spaces may be completely filled with the first conductive layer 126, and may cover upper surfaces of the second insulating layers 122.

In some example embodiments, after forming the first conductive layer 126, a planarization process, e.g., a CMP process, may be performed on the first conductive layer 126. The barrier layer 128 and second conductive layer 130 may be sequentially formed on the first conductive layer 126.

In some example embodiments, the first conductive layer 126 may include one or more of titanium (Ti), titanium nitride (TiN), tantalum (Ta), tantalum nitride (TaN), tungsten (W), tungsten nitride (WN), hafnium (Hf), niobium (Nb), molybdenum (Mo), molybdenum nitride ($Mo_2N$), ruthenium monoxide (RuO), ruthenium dioxide ($RuO_2$), iridium (Ir), iridium oxide ($IrO_2$), platinum (Pt), cobalt (Co), chromium (Cr), titanium aluminide ($Ti_3Al$), titanium aluminum nitride ($Ti_2AlN$), palladium (Pd), tungsten silicide (WSi), nickel silicide (NiSi), cobalt silicide (CoSi), tantalum silicide (TaSi), etc. For example, the first conductive layer 126 may include tantalum nitride.

In some example embodiments, the barrier layer 128 may include a metal nitride, e.g., tungsten nitride. The barrier layer 128 may be formed on the first conductive layer 126 to have a thickness of about 50 angstroms. The barrier layer 128 may function as an adhesive layer between the first conductive layer 126 and the second conductive layer 130.

In some example embodiments, the second conductive layer 130 may include a metal, e.g., tungsten, a metal silicide, e.g., tungsten silicide, tantalum silicide, cobalt silicide, titanium silicide, etc., or a polysilicon doped with impurities. The second conductive layer 130 may be formed on the barrier layer 128 to have a thickness of about 300 angstroms.

Figure 11:
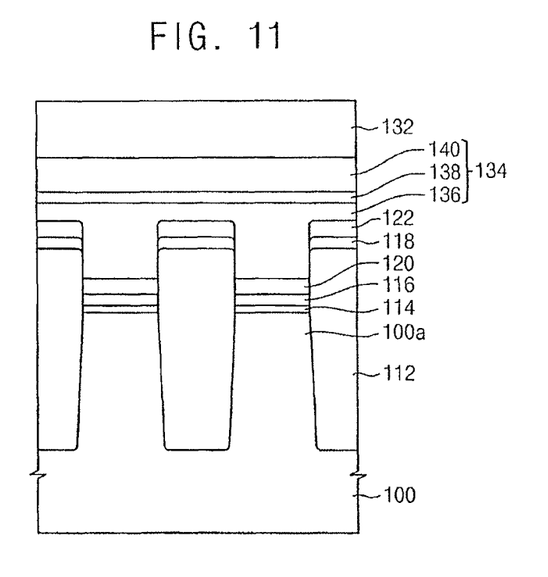
Figure 12:
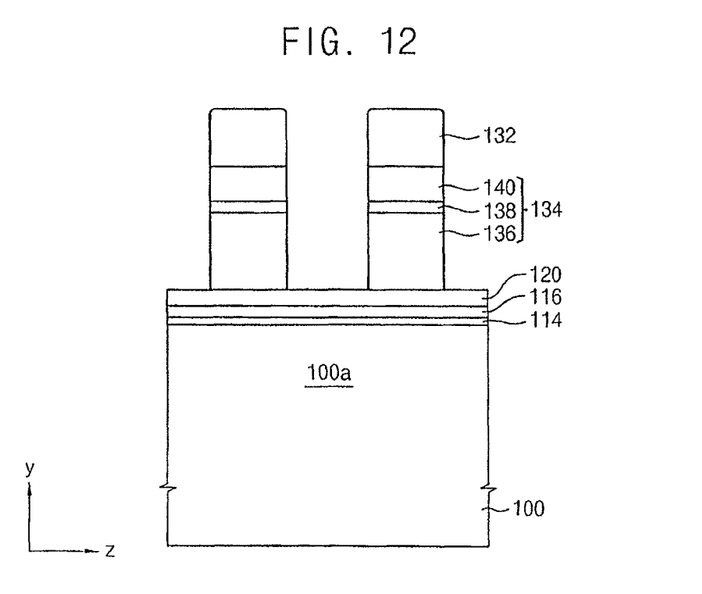
FIG. 12 illustrates a cross-sectional view of FIG. 11 along a plane perpendicular to the cross section of FIG. 11.

Referring to FIGS. 11 and 12, a hard mask layer (not shown) may be formed on the conductive layer 124. For example, the hard mask layer may include a silicon oxide. The hard mask layer may have a thickness of about 500 angstroms to about 1,500 angstroms. In this respect, it is noted that FIG. 11 illustrates a cross-sectional view along a same cross-section as FIGS. 1-10, i.e., an active region between adjacent field insulating layer patterns 112 along the xy-plane, while FIG. 12 illustrates a cross-sectional view along a line substantially perpendicular to the cross-sections of FIGS. 1-11, i.e., adjacent word lines in the active region along the zy-plane.

The hard mask layer may be patterned to form a hard mask 132. In some example embodiments, the hard mask 132 may be formed by an anisotropic etching process using a photoresist pattern. After forming the hard mask 132, the photoresist pattern may be removed by, e.g., an ashing process and/or a stripping process.

The conductive layer 124 may be patterned, e.g., by an anisotropic etching process, to form a word line structure 134 using the hard mask 132 as an etch mask. The word line structure 134 may include a first conductive layer pattern 136, a barrier layer pattern 138 and a second conductive layer pattern 140. In other words, the first conductive layer 126, barrier layer 128 and second conductive layer 130 may be patterned to form a conductive layer pattern 136, a barrier layer pattern 138 and a second conductive layer pattern 140, respectively, on the blocking layer 120 and on the second insulating layers 122. The first conductive layer pattern 136 may function as a gate electrode. The second conductive layer pattern 140 may function as a word line.

Figure 13:
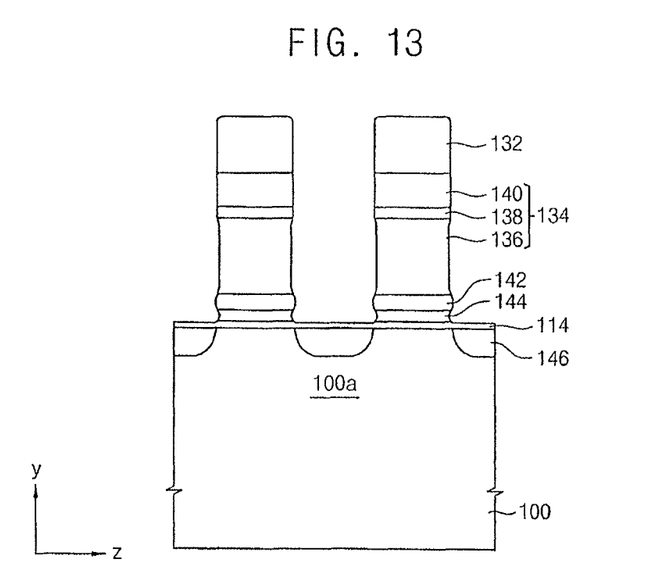
FIG. 13 illustrates a cross-sectional view of a stage subsequent to FIG. 12.

Referring to FIG. 13, the blocking layer 120 and the charge trapping layer 116 may be partially removed to electrically insulate memory cells and to prevent or substantially reduce lateral diffusion of charges from the charge trapping layer 116.

In some example embodiments, the blocking layer 120 and the charge trapping layer 116 may be partially removed by an isotropic etching process, e.g., a wet etching process using an acid solution. For example, portions of the blocking layer 120 and the charge trapping layer 116 may be removed using a phosphoric acid solution to form a blocking layer pattern 142 and a charge trapping layer pattern 144, respectively, on the semiconductor substrate 100.

It is noted that when phosphoric acid is used during wet etching to remove portions of the blocking layer 120 and charge trapping layer 116, the wet etching and phosphoric acid solution may be substantially the same as described previously with reference to FIG. 7, e.g., in terms of water concentrations and temperature of the phosphoric acid, and therefore, will not be repeated.

For example, when the blocking layer 120 and charge trapping layer 116 are formed of aluminum oxide and silicon nitride, respectively, and a phosphoric acid solution is used in the wet etching thereof, a resultant blocking layer pattern 142 may be wider than a resultant charge trapping layer pattern 144, as illustrated in FIG. 13, because aluminum oxide may have a lower etching rate than silicon nitride. It is noted that side portions of the first conductive layer pattern 136 may be partially removed by the wet etching process using the phosphoric acid solution, so the width of the charge trapping layer pattern 144 may be substantially the same as the width of the first conductive layer pattern 136, i.e., as the width of the gate electrode. In this respect, it is noted that widths of the blocking layer pattern 142, charge trapping layer pattern 144, and first conductive layer pattern 136 are measured along a direction parallel to a line connecting to adjacent word lines, i.e., the z-axis.

Alternatively, the blocking layer pattern 142 and the charge trapping layer pattern 144 may be formed using different acid solutions. For example, the blocking layer pattern 142 may be formed using a phosphoric acid solution, and the charge trapping layer pattern 144 may be formed using a sulfuric acid solution. When the charge trapping layer 116 includes a material having a high dielectric constant, the charge trapping layer pattern 144 may be formed using a fluoric acid solution. When sulfuric acid is used during wet etching to remove portions of the charge trapping layer 116 to form the charge trapping layer pattern 144, the sulfuric acid solution may be substantially the same as described previously with reference to FIG. 7, e.g., in terms of water concentrations and temperature of the sulfuric acid, and therefore, will not be repeated.

Impurity regions 146 may be formed in the upper surfaces of the active region 100a adjacent to the charge trapping layer pattern 144. The impurity regions 146 may function as source/drain regions. The impurity regions 146 may be formed by, e.g., an ion implantation process and a thermal treatment process.

In some example embodiments, after forming the word line structure 134, an insulating interlayer (not shown) may be formed between the word line structures 134 to electrically insulate the memory cells of the non-volatile memory device. Spacers (not shown) may be formed on sidewalls of the word line structure 134. In this case, after forming the spacers, the wet etching process for partially removing the blocking layer 120 and the charge trapping layer 116 may be performed.

Figure 14:
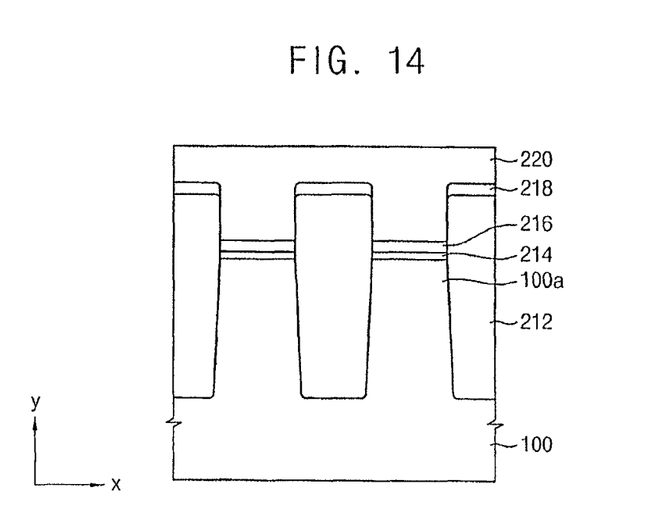
FIGS. 14 and 15 illustrate cross-sectional views of stages in a method of manufacturing a non-volatile memory device in accordance with another example embodiment.
Figure 15:
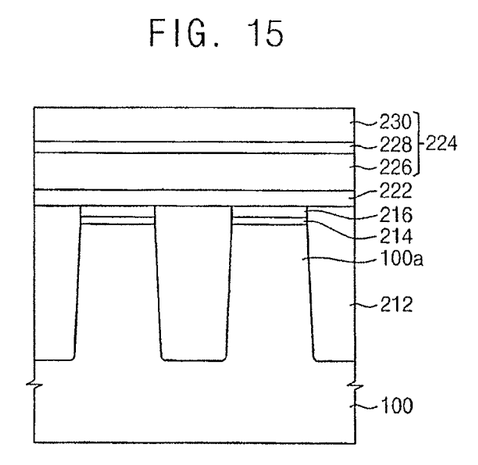

FIGS. 14 and 15 illustrate cross-sectional views of a method of manufacturing a non-volatile memory device in accordance with another example embodiment.

Referring to FIG. 14, field insulating layer patterns 212, a tunnel insulating layer 214, a charge trapping layer 216, and first insulating layers 218 may be formed on a semiconductor substrate 100. The field insulating layer patterns 212, tunnel insulating layer 214, charge trapping layer 216, and first insulating layers 218 may be substantially the same as the field insulating layer patterns 112, tunnel insulating layer 114, charge trapping layer 116, and first insulating layers 118, respectively, described previously with reference to FIGS. 1-7. Thus, detailed descriptions of structure and formation thereof will not be repeated.

After removing the extensions of the first insulating layers 218, i.e., extensions equivalent to extensions 118a of FIG. 6, spaces between the field insulating layer patterns 212 may be filled with a sacrificial layer 220. For example, the sacrificial layer 220 may be formed to contact directly the first insulating layers 218 and the charge trapping layer 216. In some example embodiments, the sacrificial layer 220 may include silicon oxide.

Referring to FIG. 15, after forming the sacrificial layer 220, a planarization process, e.g., a CMP process, may be performed on the sacrificial layer 220 to remove the sacrificial layer 220, first insulating layers 218 and upper portions of the field insulating layer patterns 212, such that upper surfaces of the charge trapping layer 216 may be exposed. In other words, after the planarization process, upper surfaces of the field insulating layer patterns 212 and charge trapping layer 216 may be substantially coplanar, as illustrated in FIG. 15. It is noted that removal of the extensions of the first insulating layers 218 may substantially facilitate the CMP process.

A blocking layer 222 and a conductive layer 224 may be sequentially formed on the charge trapping layer 216 and the field insulating layer patterns 212. Since the upper surfaces of the charge trapping layer 216 and field insulating layer patterns 212 are substantially coplanar, the blocking layer 222 may extend continuously on the upper surfaces of the charge trapping layer 216 and field insulating layer patterns 212. Accordingly, the conductive layer 224 may extend on the blocking layer 222, so the blocking layer 222 may be between upper surfaces of the field insulating layer patterns 212 and the conductive layer 224, e.g., directly between of the field insulating layer patterns 212 and the conductive layer 224. In some example embodiments, the conductive layer 224 may include a first conductive layer 226, a barrier layer 228, and a second conductive layer 230. A lower surface of the first conductive layer 226, i.e., a surface facing the semiconductor substrate 100, may be substantially planar. It is noted that the blocking layer 222, barrier layer 228, and second conductive layer 230 may be substantially the same as the blocking layer 120 and corresponding portions of the conductive layer 124 described previously with reference to FIG. 10. Thus, any further details regarding structure and formation thereof will not be repeated.

A mask pattern (not shown) may be formed on the conductive layer 224. A word line structure may be formed by an anisotropic etching process using the mask pattern as an etch mask. Processes for forming the word line structure, the blocking layer pattern, the charge trapping layer pattern and the impurity regions may be substantially the same as those described previously with reference to FIGS. 11-13. Thus, further details regarding structure and formation thereof will not be repeated.

Figure 16:
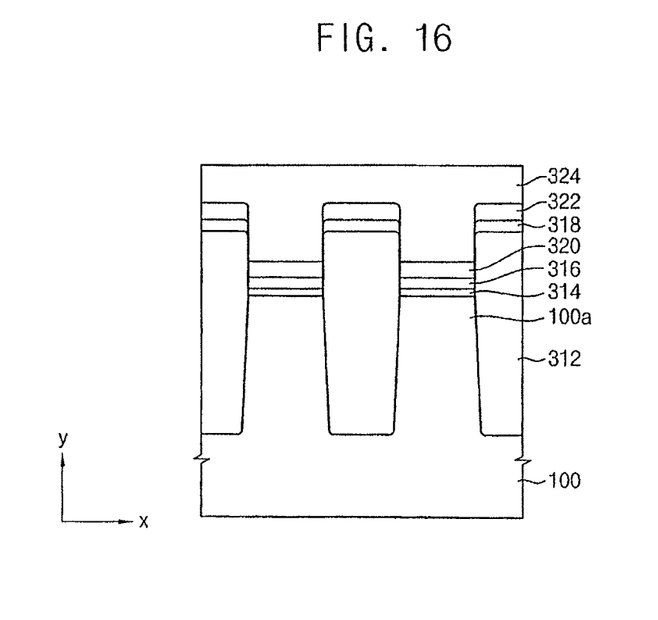
FIGS. 16 and 17 illustrate cross-sectional views of stages in a method of manufacturing a non-volatile memory device in accordance with another example embodiment.
Figure 17:
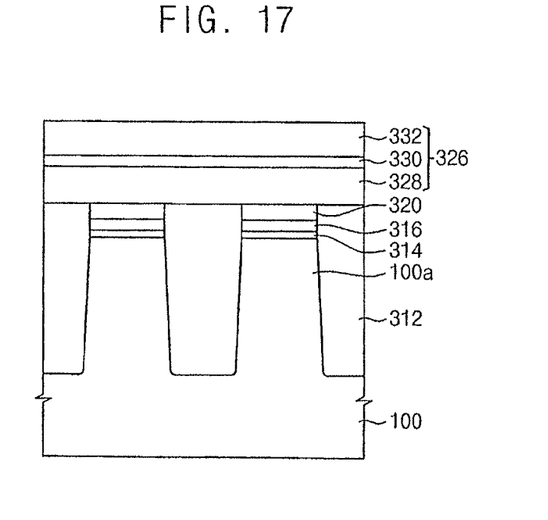

FIGS. 16 and 17 illustrate cross-sectional views of a method of manufacturing a non-volatile memory device in accordance with another example embodiment.

Referring to FIG. 16, field insulating layer patterns 312, a tunnel insulating layer 314, a charge trapping layer 316, first insulating layers 318, a blocking layer 320 and second insulating layers 322 may be formed on a semiconductor substrate 100. The field insulating layer patterns 312, tunnel insulating layer 314, charge trapping layer 316, first insulating layers 318, blocking layer 320 and second insulating layers 322 may be substantially the same as the field insulating layer patterns 112, tunnel insulating layer 114, charge trapping layer 116, first insulating layers 118, blocking layer 120, and second insulating layers 122, respectively, described previously with reference to FIGS. 1-9. Thus, detailed descriptions of structure and formation thereof will not be repeated.

After removing the extensions of the second insulating layers 322, i.e., extensions equivalent to extensions 122a of FIG. 8, spaces between the field insulating layer patterns 312 may be filled with a sacrificial layer 324. For example, the sacrificial layer 324 may be formed to contact directly the second insulating layers 322 and the blocking layer 320. In some example embodiments, the sacrificial layer 324 may include silicon oxide.

Referring to FIG. 17, after forming the sacrificial layer 324, a planarization process, e.g., a CMP process, may be performed on the sacrificial layer 220 to remove upper portions of the sacrificial layer 220, second insulating layers 322, first insulating layers 318 and field insulating layer patterns 312 to expose the blocking layer 320. In other words, after the planarization process, upper surfaces of the field insulating layer patterns 312 and blocking layer 320 may be substantially coplanar, as illustrated in FIG. 17. It is noted that removal of the extensions of the first insulating layers 318 and second insulating layers 322 may substantially facilitate the CMP process.

A conductive layer 326 may be sequentially formed on the blocking layer 320 and the field insulating layer patterns 212. Since the upper surfaces of the field insulating layer patterns 312 and blocking layer 320 are substantially coplanar, the conductive layer 326 may contact, e.g., directly, the field insulating layer patterns 212. In some example embodiments, the conductive layer 326 may include a first conductive layer 328, a barrier layer 330 and a second conductive layer 332. A lower surface of the first conductive layer 326, i.e., a surface facing the semiconductor substrate 100, may be substantially planar. It is noted that the blocking layer 320, barrier layer 328, and second conductive layer 332 may be substantially the same as the blocking layer 120 and corresponding portions of the conductive layer 326 described previously with reference to FIG. 10 and, therefore, detailed description thereof will not be repeated.

A mask pattern (not shown) may be formed on the conductive layer 326. A word line structure may be formed by an anisotropic etching process using the mask pattern as an etch mask. Processes for forming the word line structure, the blocking layer pattern, the charge trapping layer pattern and the impurity regions may be substantially the same as those described previously with reference to FIGS. 11-13. Thus, further details regarding structure and formation thereof will not be repeated.

According to example embodiments, the charge trapping layer patterns may be electrically insulated from each other by the insulating interlayers between the field insulating layer patterns and the memory cells. Thus, lateral diffusion of the charges in the charge trapping layer patterns may be substantially suppressed or prevented. As a result, the non-volatile memory device including the memory cells may have improved thermal stress characteristics and data reliability.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a non-volatile memory device, the method comprising:
    forming field insulating layer patterns on a substrate to define an active region of the substrate, upper portions of the field insulating layer patterns protruding above an upper surface of the substrate;
    forming a tunnel insulating layer on the active region;
    forming a charge trapping layer on the tunnel insulating layer;
    forming a blocking layer on the charge trapping layer;
    forming first insulating layers on upper surfaces of the field insulating layer patterns;
    forming a sacrificial layer on the charge trapping layer and field insulating layer patterns, the sacrificial layer filling spaces between adjacent field insulating layer patterns;
    performing a planarization process to remove the sacrificial layer, the first insulating layers, and the upper portions of the field insulating layer patterns;
    forming a conductive layer on the blocking layer, a lowermost surface of the conductive layer facing the blocking layer being substantially planar; and
    forming a word line structure on the blocking layer, on the first insulating layers, and on the conductive layer.

2. The method as claimed in claim 1, wherein the charge trapping layer and the first insulating layers are formed by a physical vapor deposition (PVD) process.

3. The method as claimed in claim 2, wherein the charge trapping layer and the first insulating layers are formed by a sputtering process.

4. The method as claimed in claim 1, wherein forming the first insulating layers includes forming extensions connecting the first insulating layers and the charge trapping layer along side surfaces of the field insulating layer patterns, the extensions of the first insulating layers being thinner than the charge trapping layer.

5. The method as claimed in claim 4, wherein forming the first insulating layers further comprises removing the extensions of the first insulating layers by an isotropic etching process, such that the first insulating layers are completely separated from the charge trapping layer.

6. The method as claimed in claim 1, further comprising forming second insulating layers on the first insulating layers, the second insulating layers being between the word line structure and the first insulating layers.

7. The method as claimed in claim 6, wherein the blocking layer and the second insulating layers are formed by a physical vapor deposition (PVD) process.

8. The method as claimed in claim 7, wherein the blocking layer and the second insulating layers are formed by a sputtering process.

9. The method as claimed in claim 6, wherein forming the second insulating layers includes forming extensions connecting the second insulating layers and the blocking layer along side surfaces of the field insulating layer patterns, the extensions of the second insulating layers being thinner than the blocking layer.

10. The method as claimed in claim 9, wherein forming the second insulating layers further comprises removing the extensions of the second insulating layers by an isotropic etching process, such that the second insulating layers are completely separated from the blocking layer.

11. The method as claimed in claim 1, wherein forming the blocking layer includes forming the blocking layer to be wider than the charge trapping layer along a first direction, the first direction extending in parallel to a line connecting adjacent word line structures.

12. The method as claimed in claim 1, wherein performing the planarization process includes:
    forming upper surfaces of the charge trapping layer and field insulating layer patterns to be substantially coplanar; and
    forming the blocking layer on the upper surfaces of the charge trapping layer and field insulating layer patterns, a lowermost surface of the blocking layer facing the charge trapping layer being substantially planar.

13. The method as claimed in claim 1, further comprising forming second insulating layers on the first insulating layers, and performing the planarization process includes:
    forming upper surfaces of the blocking layer and field insulating layer patterns to be substantially coplanar.

* * * * *